United States Patent
Waechter et al.

(10) Patent No.: US 10,435,292 B2
(45) Date of Patent: Oct. 8, 2019

(54) METHOD FOR PRODUCING A SEMICONDUCTOR MODULE

(71) Applicant: Infineon Technologies AG, Neubiberg (DE)

(72) Inventors: Claus Waechter, Sinzing (DE); Edward Fuergut, Dasing (DE); Bernd Goller, Otterfing (DE); Michael Ledutke, Saal (DE); Dominic Maier, Pleystein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/651,522

(22) Filed: Jul. 17, 2017

(65) Prior Publication Data
US 2018/0022601 A1    Jan. 25, 2018

(30) Foreign Application Priority Data
Jul. 20, 2016   (DE) .................. 10 2016 113 347

(51) Int. Cl.
*H01L 27/14*   (2006.01)
*B81C 1/00*    (2006.01)
*B81B 7/00*    (2006.01)

(52) U.S. Cl.
CPC ........ *B81C 1/00269* (2013.01); *B81B 7/0058* (2013.01); *B81B 7/0077* (2013.01); *B81C 1/00888* (2013.01); *B81B 2201/0235* (2013.01); *B81B 2201/0257* (2013.01); *B81B 2203/0127* (2013.01); *B81B 2203/0315* (2013.01); *B81B 2207/012* (2013.01); *B81B 2207/09* (2013.01); *B81B 2207/092* (2013.01); *B81B 2207/096* (2013.01); *B81C 2201/034* (2013.01); *B81C 2203/0118* (2013.01); *B81C 2203/032* (2013.01); *B81C 2203/0792* (2013.01)

(58) Field of Classification Search
USPC .............. 257/414, E31.117, 676, E21.504, 257/E23.066, 678, 99; 438/51
See application file for complete search history.

(56) References Cited

U.S. PATENT DOCUMENTS

| | | | |
|---|---|---|---|
| 5,824,177 A | 10/1998 | Yoshihara et al. | |
| 6,106,735 A | 8/2000 | Kurle et al. | |
| 6,483,030 B1 | 11/2002 | Glenn et al. | |
| 6,839,962 B2 | 1/2005 | Aigner et al. | |
| 8,017,435 B2 | 9/2011 | Leib et al. | |
| 8,169,041 B2 | 5/2012 | Pahl et al. | |
| 8,872,288 B2 | 10/2014 | Fuergut et al. | |

(Continued)

FOREIGN PATENT DOCUMENTS

| | | |
|---|---|---|
| CN | 101081692 | 12/2007 |
| CN | 101237720 | 8/2008 |
| CN | 104538462 | 4/2015 |
| CN | 104604248 | 5/2015 |
| DE | 197 00 734 | 7/1998 |
| DE | 19700734 | 7/1998 |

(Continued)

*Primary Examiner* — Niki H Nguyen
(74) *Attorney, Agent, or Firm* — Dicke, Billig & Czaja, PLLC

(57) ABSTRACT

The method comprises fabricating a semiconductor panel comprising a plurality of semiconductor devices, fabricating a cap panel comprising a plurality of caps, bonding the cap panel onto the semiconductor panel so that each one of the caps covers one or more of the semiconductor devices, and singulating the bonded panels into a plurality of semiconductor modules.

21 Claims, 9 Drawing Sheets

(56) References Cited

U.S. PATENT DOCUMENTS

| | | | |
|---|---|---|---|
| 9,002,038 B2 | 4/2015 | Ochs et al. | |
| 9,061,893 B1 | 6/2015 | Minervini | |
| 9,146,253 B2 | 9/2015 | Aono et al. | |
| 9,162,871 B1 | 10/2015 | Kuo et al. | |
| 9,352,956 B2 | 5/2016 | Cheng et al. | |
| 9,556,022 B2 | 1/2017 | Pahl | |
| 9,584,889 B2 | 2/2017 | Escher-Poeppel et al. | |
| 9,725,303 B1* | 8/2017 | Maier | B81B 7/0064 |
| 9,981,843 B2 | 5/2018 | Maier et al. | |
| 2004/0082119 A1* | 4/2004 | Silverbrook | B29C 43/36 |
| | | | 438/199 |
| 2008/0203560 A1 | 8/2008 | Suzuki | |
| 2015/0061106 A1 | 3/2015 | Hooper et al. | |
| 2016/0090301 A1* | 3/2016 | Cachia | B81C 1/00238 |
| | | | 257/737 |
| 2016/0276307 A1* | 9/2016 | Lin | H01L 21/561 |
| 2017/0038209 A1* | 2/2017 | Bowles | G01C 19/5783 |
| 2017/0320726 A1* | 11/2017 | Leitgeb | B81C 1/0023 |

FOREIGN PATENT DOCUMENTS

| | | |
|---|---|---|
| DE | 10013067 | 9/2000 |
| DE | 199 62 231 | 7/2001 |
| DE | 102004004476 | 7/2005 |
| DE | 10 2005 053 765 | 5/2007 |
| DE | 102005053765 | 5/2007 |
| DE | 10 2006 032 925 | 1/2008 |
| DE | 102006032925 | 1/2008 |
| DE | 10 2013 108 353 | 2/2014 |
| DE | 102013108353 | 2/2014 |
| DE | 10 2013 106 353 | 12/2014 |
| DE | 10 2014 216 223 | 3/2015 |
| DE | 102014216223 | 3/2015 |
| DE | 10 2014 019 445 | 7/2015 |
| DE | 10 2015 106 442 | 11/2016 |
| DE | 102015106442 | 11/2016 |
| EP | 2 573 514 | 3/2013 |
| EP | 2573514 | 7/2015 |

* cited by examiner

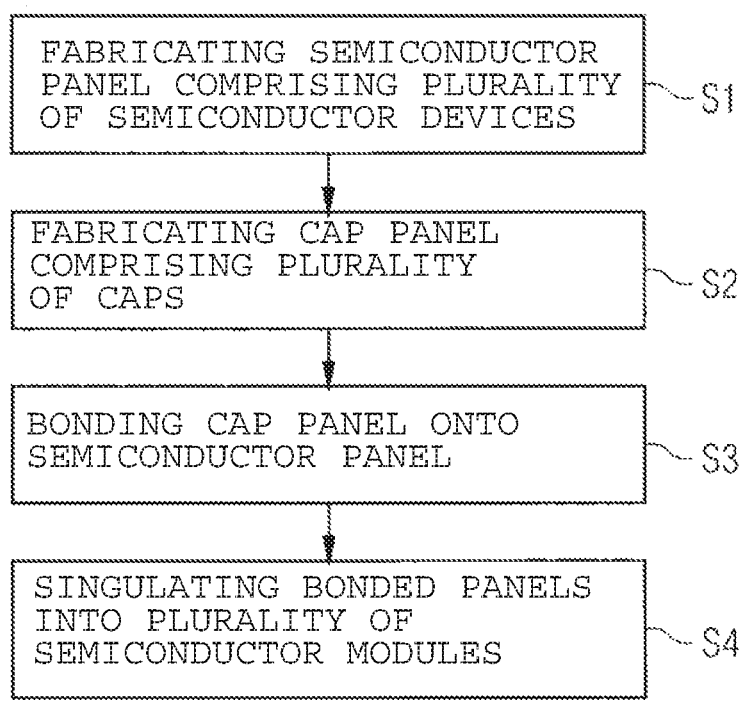

METHOD FOR PRODUCING A SEMICONDUCTOR MODULE

CROSS-REFERENCE TO RELATED APPLICATION

This Utility Patent Application claims priority to German Patent Application No. 10 2016 113 347.7, filed Jul. 20, 2016, which is incorporated herein by reference.

BACKGROUND

The present disclosure relates to a method for producing a semiconductor module, and to a semiconductor module. Microphones, pressure and gas sensors are implemented in electronic devices such as, for example, smartphones, tablet computers, laptop computers, automotive and medical devices, and wearable devices in the area of lifestyle, and may nowadays be constructed as silicon micro-electromechanical systems (MEMS). In a microphone a back volume is formed below or behind a MEMS sound device. The term "back volume" may refer to a space opposite to a MEMS sound component like, for example, a membrane on which sound waves may impinge and may also be referred to as a backside cavity. In general, it is known that, when the back volume is increased, microphone sensitivity, e.g. signal-to-noise ratio, can be further increased and a better frequency response curve can be achieved. The back volume is limited on one side by a cap or lid which covers the microphone cavity. The present disclosure is also related to other sensors which may comprise a cap like, for example, shock sensors, acceleration sensors, temperature sensors, gas sensors, humidity sensors, magnetic field sensors, electric field sensors, or optical sensors. In order to further reduce the manufacturing costs of these devices, those skilled in the art permanently strive to develop more efficient and practicable fabrication methods.

SUMMARY

In accordance with a first aspect of the disclosure a method for producing a semiconductor module comprises fabricating a semiconductor panel comprising a plurality of semiconductor devices, fabricating a cap panel comprising a plurality of caps, bonding the cap panel onto the semiconductor panel so that each one of the caps covers one or more of the semiconductor devices, and singulating the bonded panels into a plurality of semiconductor modules.

In accordance with a second aspect of the disclosure a semiconductor module comprises a semiconductor device, and a cap disposed above the semiconductor device, wherein the semiconductor module is fabricated by bonding a cap panel comprising a plurality of caps onto a semiconductor panel comprising a plurality of semiconductor devices, and singulating the bonded panels into a plurality of semiconductor modules.

In accordance with a third aspect of the disclosure a packaged MEMS device comprises an embedding arrangement, a MEMS device disposed in the embedding arrangement, a cap disposed above the MEMS device, wherein the packaged MEMS device is fabricated by bonding a cap panel comprising a plurality of caps onto a MEMS panel comprising a plurality of MEMS devices, and singulating the bonded panels into a plurality of packaged MEMS devices.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

FIG. 1 shows a flow diagram for illustrating a method for producing a semiconductor module according to an example.

DETAILED DESCRIPTION

Figure 2A:
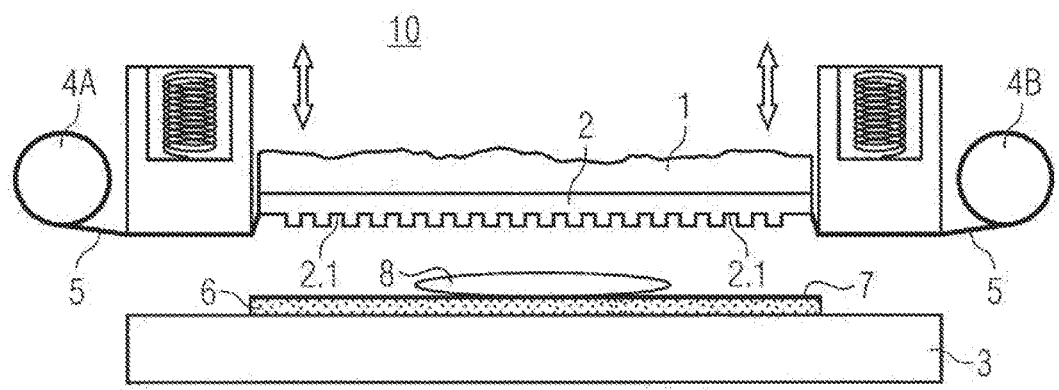
FIG. 2 comprises FIGS. 2A and 2B and shows schematic cross-sectional side view representations of a molding apparatus for illustrating a method for fabricating a cap panel comprising a plurality of caps according to an example in which foil-assisted compression molding is employed and a carrier is placed onto a lower mold form of the molding apparatus.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

The examples of a method for producing a semiconductor module, and the examples of a semiconductor module and of a packaged MEMS device may comprise a first mold compound having the semiconductor devices embedded therein, and a second mold compound being the material of the cap panel comprising the plurality of caps. The first and second mold compounds can be any electrically insulating material like, for example, any kind of molding material, any kind of resin material, or any kind of epoxy material, a bismaleimide, or a cyanate ester. The first and second mold compounds can also be a polymer material, a polyimide material, or a thermoplast material. The first and second mold compounds may also comprise any of the above-mentioned materials and further include filler materials embedded therein like, for example, thermally conductive increments. These filler increments can be made of SiO, SiC, Al2O3, ZnO, AlN, BN, MgO, Si3N4, or ceramic, or a metallic material like, for example, Cu, Al, Ag, or Mo. Furthermore the filler increments may have the shape of fibers and can be made of carbon fibers or nanotubes, for example. The mold compounds may also include further additives for adjusting manufacturing properties.

Insofar as a method for producing a semiconductor module is described as having a specific order of method steps, it should be mentioned that any other appropriate order of the method steps may be employed by the skilled person. It should further be mentioned that any comments, remarks or features mentioned in connection with a described method are to be understood as also disclosing a device being obtained or resulting from such comments, remarks or features, even if such a device is not explicitly described or illustrated in the figures. Furthermore any comments, remarks or features mentioned in connection with a device are to be understood as also disclosing a method step for providing or fabricating the respective device feature.

FIG. 1 shows a flow diagram for illustrating a method for producing a semiconductor module according to a first aspect. The method comprises fabricating a semiconductor panel comprising a plurality of semiconductor devices (s1), fabricating a cap panel comprising a plurality of caps (s2), bonding the cap panel onto the semiconductor panel so that each one of the caps covers one or more of the semiconductor devices (s3), and singulating the bonded panels into a plurality of semiconductor modules (s4).

The cap panel can be fabricated by a variety of different methods as will be outlined as follows.

According to an example of the method of the first aspect, fabricating the cap panel comprises forming. According to a further example thereof, fabricating the cap comprises molding, in particular compression molding, transfer molding, and injection molding, each of them either foil-assisted or non-foil-assisted. A particular example of a molding process will be shown and explained further below in connection with FIGS. 2 and 3.

According to an example of the method of the first aspect, fabricating the cap panel comprises ablating, stamping, cutting, punching, or embossing. For example, at first a precursor panel can be provided and then particular portions of the precursor panel can be removed by ablating, stamping, cutting, punching, or embossing in order to obtain a cap panel of a desired form and structure. In particular, those portions are removed which are intended to be the cavities covered by the caps.

According to an example of the method of the first aspect, fabricating the cap panel comprises deep-drawing.

According to an example of the method of the first aspect, fabricating the cap panel comprises any further kind of generative forming the cap panel like, for example, providing an appropriate powder and forming the cap panel out of the powder, in particular with the assistance of heat and/or pressure.

According to an example of the method of the first aspect, the cap panel can be fabricated by any one of the above mentioned methods, by use of any appropriate material. The cap panel can be fabricated out of any kind of mold compound as was outlined above, but also of semiconductor material like Si, of glass, of ceramic, or of metal.

According to an example of the method of the first aspect, each one of the semiconductor devices comprises a sensor device. According to a further example thereof each one of the semiconductor devices comprises one or more of a pressure sensor, a shock sensor, an acceleration sensor, a temperature sensor, a gas sensor, a humidity sensor, a magnetic field sensor, an electric field sensor, or an optical sensor.

According to an example of the method of the first aspect each one of the semiconductor devices comprises a MEMS device. In particular, in case of a microphone or pressure sensor, the semiconductor device comprises a MEMS fabricated membrane.

According to an example of the method of the first aspect, the semiconductor panel is a reconfigured wafer fabricated by extended wafer level technology, i.e. obtained by processing a plurality of semiconductor chips in a semiconductor wafer, dicing out the semiconductor chips, and embedding the semiconductor chips in an encapsulant. The obtained reconfigured wafer can have any desired shape. It can have circular form or rectangular or quadratic form.

According to an example of the method of the first aspect, the semiconductor panel is a semiconductor wafer comprising a plurality of semiconductor devices processed therein. In this case the semiconductor panel does not comprise any mold material in between the individual semiconductor devices.

According to an example of the method of the first aspect, the plurality of caps fabricated on the panel corresponds to the plurality of semiconductor devices on the semiconductor panel. It may be the case that each semiconductor module comprises no more than one semiconductor device like, for example, a specific sensor out of the variety of sensors as were listed above. Alternatively, it can also be the case that each semiconductor module comprises more than one semiconductor device. For example, there can be a sensor device and another electrical device like, for example, any kind of controller device connected with the sensor device. The controller device can, for example, be an ASIC (application-specific integrated circuit) that may be used to provide, e.g., a power supply for the sensor and/or read-out functionality for providing an electrical signal that corresponds to a particular parameter or its magnitude measured by the sensor. The controller device or ASIC may also perform as an amplifier and/or analog-to-digital converter. As another example, the semiconductor module may comprise two sensor devices. The two sensor devices may have different functionalities like, for example one sensor being a pressure sensor and the other one being a temperature sensor. They also may have equal functionalities but different sensitivities like, for example, one sensor has a relatively high sensitivity and another sensor has a relatively low sensitivity. In case of a pressure sensor, for example, it may be provided that one pressure sensor has a relatively large back volume thus yielding a relatively high sensitivity, and another pressure sensor has a relatively small back volume thus yielding low sensitivity. It will be illustrated further below, in which way the dimensions of the back volume could be adjusted.

According to an example of the method of the first aspect, fabricating the cap panel comprises providing the caps or portions thereof with an electrical conductivity. According to an example thereof, an electrically conductive layer can be applied to a wall of the caps, i.e. to an inner wall or an outer wall, or can be integrated in the caps. According to an example, the caps can also be fabricated from electrically conducting material, i.e. by incorporating electrically conducting increments into a host material like, e.g. a mold material. The electrical conductivity may provide at least one of the following functionalities: shielding of the semiconductor device, shielding of the interconnect to controller device, e.g. ASIC, or shielding of underlying redistribution layers.

According to an example of the method of the first aspect, an opening is formed in each one of the caps so that in case of a microphone or pressure sensor a sound wave or a gaseous medium can enter the cavity of the sensor device. In case of an optical sensor, for example, a lens can be mounted into the opening in order to bundle a light wave into the interior of the sensor. Alternatively in the semiconductor module an opening is not necessarily formed in the cap but in the semiconductor device or in the encapsulant.

According to an example of the method of the first aspect, bonding of the cap panel onto the semiconductor panel can be performed by glueing or adhering or by soldering in case of metallic surfaces. The glue or adhesive can be applied onto one or both of the surfaces by printing, for example.

Figure 2B:
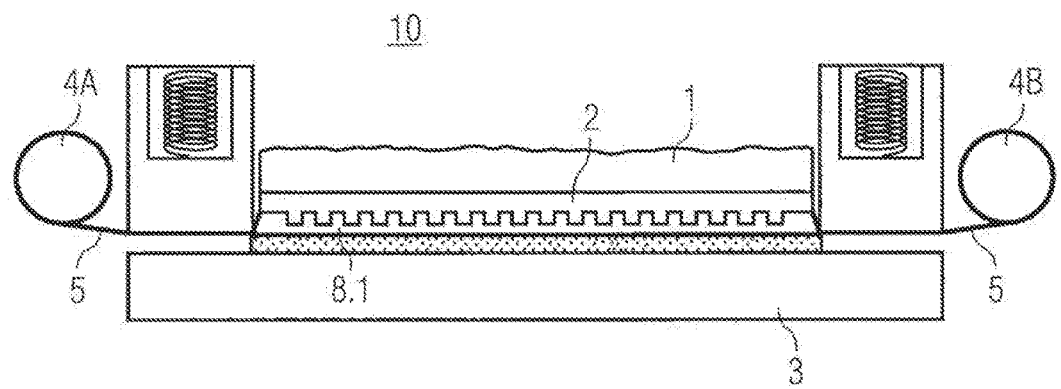

FIG. 2 comprises FIGS. 2A and 2B and illustrates an example of a method for fabricating the cap panel wherein a molding apparatus 10 comprises an upper mold form 1 and an attachment 2 applied to the upper mold form 1, and a lower mold form 3, wherein the attachment 2 comprises a lower surface 2.1 which comprises a surface structure which is inverse to the surface structure of the plurality of caps to be produced. The molding apparatus 10 further comprises rollers 4A and 4B for feeding in a foil 5 which is to be applied to the lower surface 2.1 of the attachment 2. A carrier 6 is applied onto the lower mold form 3 and an adhesion foil 7 is adhered to an upper surface of the carrier 6.

FIG. 2A shows the beginning of the molding process. According to the present example, compression molding is employed. A particular amount of a mold compound 8 is placed onto the carrier 6, more specifically onto the adhesion foil 7. Thereafter the upper mold form 1 is moved in a downward direction so that upon reaching the mold compound 8, the mold compound 8 spreads in a lateral direction and flows into the various indentations formed in the lower surface 2.1 of the attachment 2. Thereafter the mold compound is cured or solidified and thereafter the finished panel 8.1 is taken out of the molding apparatus.

It should be mentioned that the above described process can in principle also be performed without using the foil 5 applied to the attachment 2.

It should further be mentioned that also other molding methods can be employed like, for example, transfer molding or injection molding.

Figure 3A:
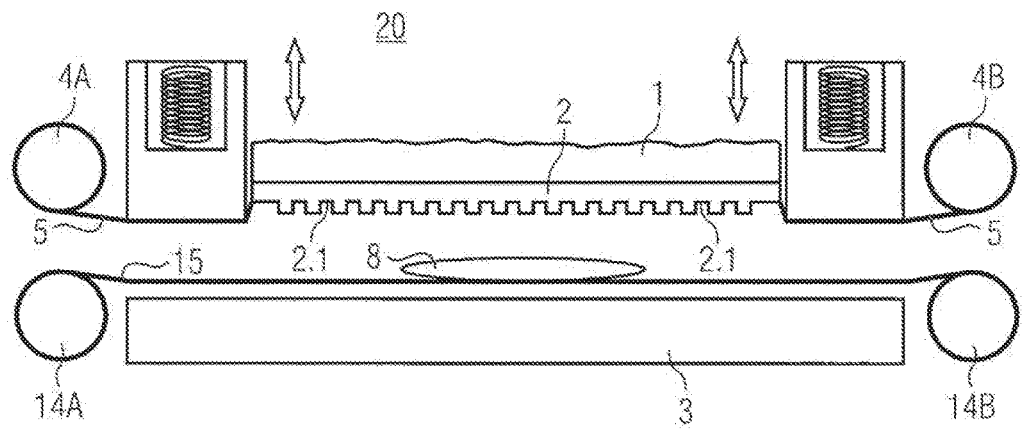
FIG. 3 comprises FIGS. 3A and 3B and shows schematic cross-sectional side view representations of a molding apparatus for illustrating a method for fabricating a cap panel comprising a plurality of caps according to an example in which foil-assisted compression molding is employed and no carrier but instead an additional foil is used.
Figure 3B:
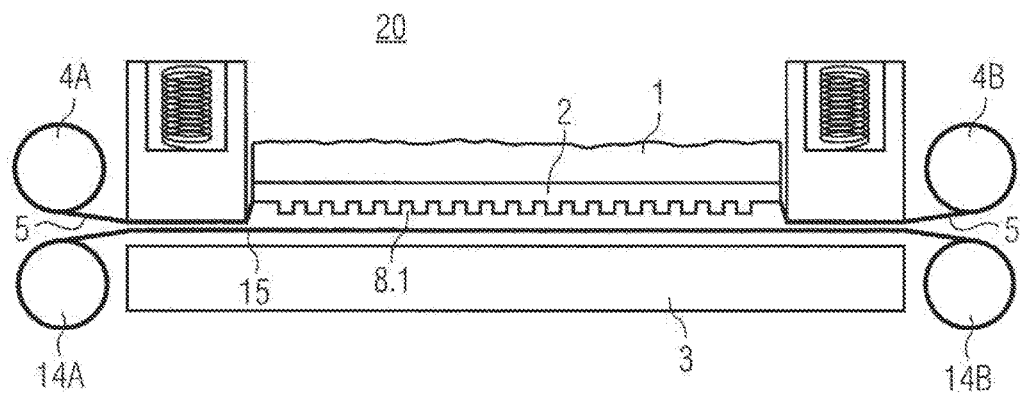

FIG. 3 comprises FIGS. 3A and 3B and illustrates a similar process of fabricating a panel comprising a plurality of caps, wherein a molding apparatus 20 is employed. A difference to the molding apparatus 10 of FIG. 2 is that the carrier 6, as shown in FIG. 2, is omitted and instead a further foil 15 is fed into the molding apparatus 20 by rollers 14A and 14B. As shown in FIG. 3A the mold compound 8 is applied onto an upper surface of the foil 15 and thereafter the process is similar to the one described in connection with FIG. 2.

The examples of FIG. 2 and FIG. 3 illustrate a so-called cavity-up mode, meaning that the upper mold form 1 comprises the attachment 2 which determines the form of the cap panel to be produced. However, the molding apparatus can also be of a cavity-down mode in which the lower mold form comprises the attachment determining the form of the cap panel to be produced.

Figure 4A:
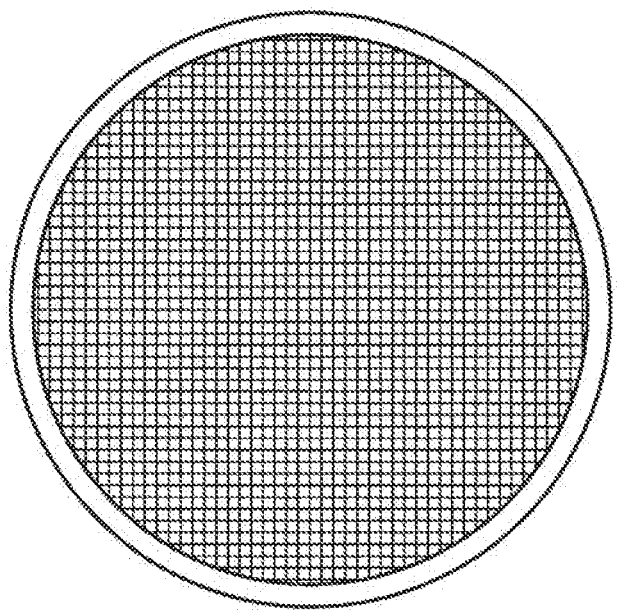
FIG. 4 comprises FIGS. 4A and 4B and shows a schematic representation of the fabricated cap panel comprising a plurality of caps comprising circular wafer form (A) and rectangular or quadratic form (B).
Figure 4B:
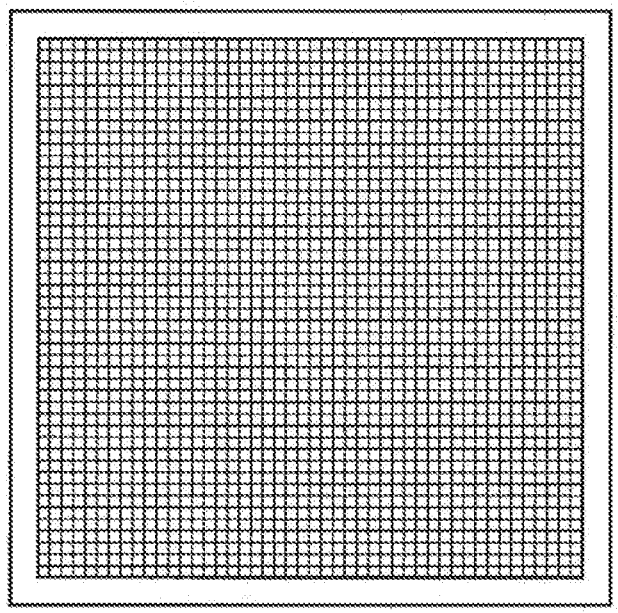

FIG. 4 comprises FIGS. 4A and 4B wherein FIG. 4A shows an example of a panel comprising a plurality of caps, wherein the panel has a circular form or the form of a typical wafer. It should be mentioned that the panel can also have any other form like, for example, a rectangular or a quadratic form as shown in FIG. 4B. In the same way, as was already outlined above, also the semiconductor panel can have a typical wafer form but also any other form like, for example, rectangular or quadratic form. The cap panel 40, as shown in FIG. 4, comprises a plurality of caps or cavities 41, wherein the number of caps can be in the range of 1000; or several 1000, in particular in a range between 1000 and 10000. The panel 40 may further comprise a peripheral edge portion 42 in which no caps are formed and which serves for stiffening and stabilizing the panel 40.

Figure 5A:
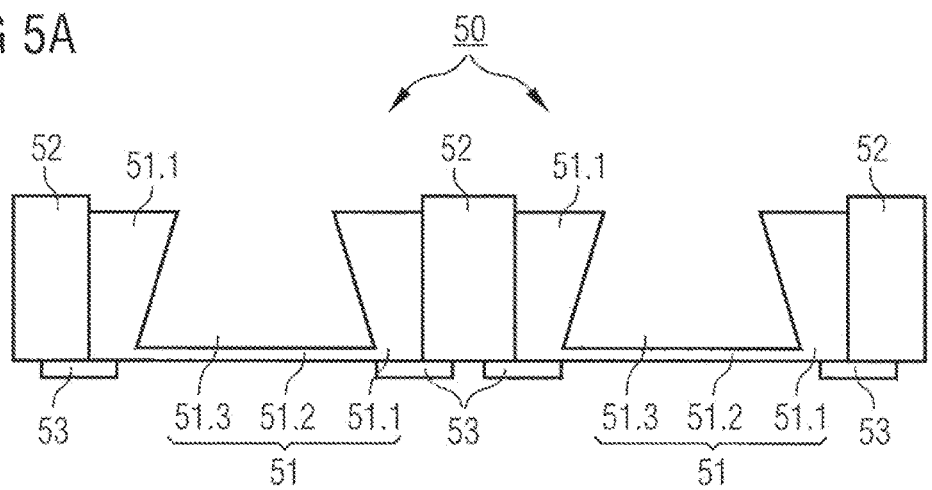
FIG. 5 comprises FIGS. 5A and 5B and shows schematic cross-sectional side view representations of a section of a reconfigured wafer comprising a plurality of semiconductor devices (A), and the same section after bonding the cap panel comprising a plurality of caps onto the reconfigured wafer (B).
Figure 5B:
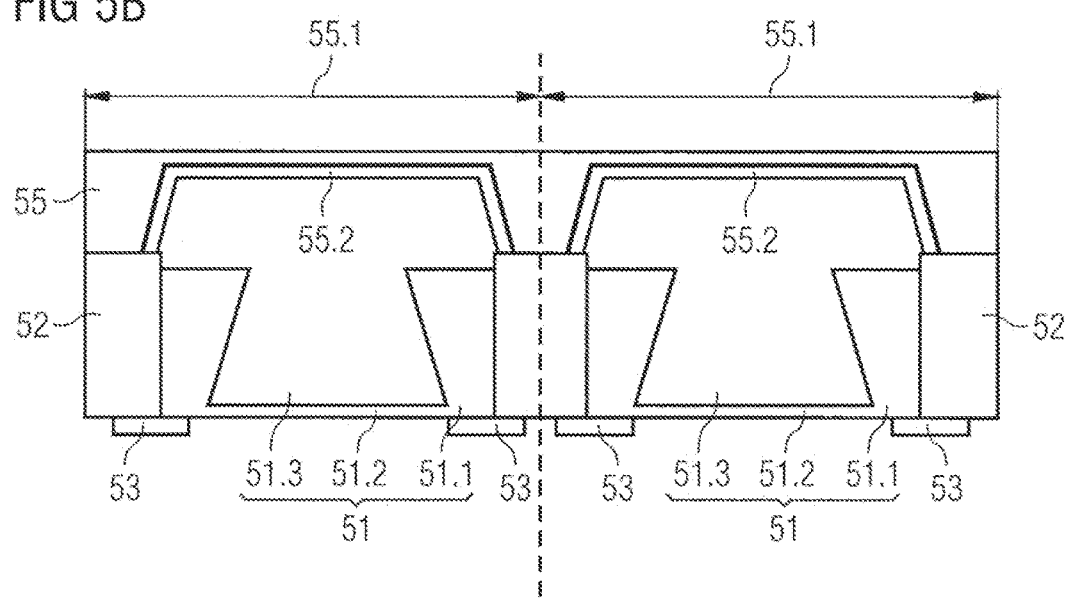

FIG. 5 comprises FIGS. 5A and 5B and shows in somewhat more detail a section of the semiconductor panel before and after bonding the cap panel onto it. In the example of FIG. 5 the semiconductor panel is a reconfigured wafer. FIG. 5A shows two neighboring semiconductor devices 50, wherein each one of the semiconductor devices 50 comprises a semiconductor body 51 comprising side walls 51.1 and a microphone membrane 51.2 connected between the side walls 51.1. The side walls 51.1 may be configured in such a way that they comprise four peripherally connected outer faces and an inner face which is circular in cross-section, see for example FIG. 7B.

Anyway the side walls 51.1 surround an inner space 51.3 above the microphone membrane 51.2. The semiconductor devices 50 further comprise a mold compound (first mold compound) 52 which is arranged in such a way that it embeds each one of the semiconductor bodies 51 on all four sides. The semiconductor devices 50 further comprise electrical contact areas 53 applied onto a back surface of the reconfigured wafer 50 and connected with one or more of the microphone membrane 51.2 and possible other electrical devices included in the semiconductor body 51.

FIG. 5B shows an intermediate product (bonded panels) obtained after applying a cap panel 55 onto an upper surface of the reconfigured wafer. The cap panel 55 may correspond to the panel 40 as shown in FIG. 4 and may comprise a plurality of caps 55.1, wherein each one of the caps 55.1 is positioned precisely above one of the semiconductor devices 50 and the vertical walls of the panel 55 are precisely and centrally set upon the walls of the mold compound 52. In the example as shown in FIG. 5B, the inner wall of the caps 55.1 comprise a planar horizontal wall and planar side walls adjoining the horizontal wall. Furthermore it can be seen in FIG. 5B that the side walls are inclined so that an angle between the horizontal wall and the side walls is different from 90°, in the present example greater than 90°. Such a configuration helps to avoid shear forces when bonding the panel 55 onto the reconfigured wafer and thereby vertically pressing the panel 55 onto the reconfigured wafer 50. Moreover, the inclined walls are advantageous when releasing the panel 8.1 from the mold forms 1 and 2 as was shown in FIG. 2 and FIG. 3. In order to obtain inclined side walls the attachment 2 on the upper mold form 1 must have a corresponding inverse surface structure.

The example as shown in FIG. 5B also shows a sharp or abrupt junction between the horizontal wall and the side walls of the cap 55.1 with a clearly defined angle between them. However, it can also be the case that the junction between the horizontal wall and the side walls is smooth or curved having a particular radius of the curve.

According to another example, it is also possible that the inner wall of the caps do not comprise any planar wall but a completely curved surface as, for example, a spherical surface or an ellipsoidal surface.

The example as shown in FIG. 5B also shows that the inner walls of the caps 55.1 comprise a thin layer 55.2 of an electrically conductive material like, for example, Cu or Al which serves to electrically shield the semiconductor device from the outside. Alternatively, it is also possible to omit the layer 55.2 and instead to fabricate the panel 55 out of an electrically conductive material.

As mentioned before, the panel 55 comprises a mold compound (second mold compound) the material of which can be different, similar or identical to the material of the first mold compound 52. In particular, it can be the case that the first and second mold compounds comprise completely identical materials, which means that they comprise identical host materials and also identical amounts and types of filler increments incorporated therein. This is advantageous as thermal expansion coefficients (CTE) of first and second mold compounds are equal so that in operation of the microphone device no problems will occur at the boundary between the mold compounds because of different CTEs. However, it can also be the case that the first and second mold compounds comprise similar or identical host materials, but one or more of different amounts or different types of filler increments embedded therein. In particular, this may be the case if one wants to have an electrically conductive cap 55.1 in order to avoid the application of the layer 55.2 in which case a sufficient amount of conductive filler increments have to be incorporated into the second mold compound. As the first mold compound 52 has to be insulating, the first and second mold compounds will then be necessarily different in this case.

After bonding the panel 55 onto the reconfigured wafer, the obtained intermediate product can be singulated to obtain a plurality of individual microphone devices. The vertical dashed line in FIG. 5B indicates the plane along which neighboring microphone devices can be separated from each other by, for example, dicing, stealth dicing, sawing, etching, laser ablating, or any suitable combinations out of these.

The cap panel 55 as shown in the example of FIG. 5B, comprises a flat upper surface. It should be mentioned, however, that when fabricating the cap panel also the upper surface can be formed or structured in any desired way for different reasons like e.g. increasing the stability of the cap, or facilitating the singulating by forming grooves at the boundaries of the semiconductor modules, or forming markings like numbers or crosses into the upper surface.

Figure 6A:
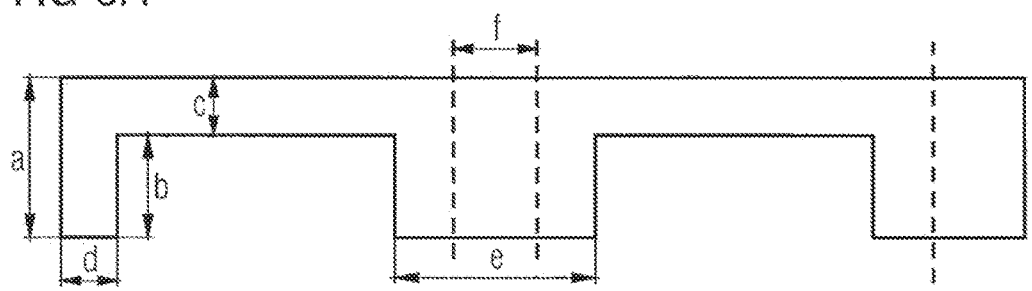
FIG. 6 comprises FIGS. 6A and 6B and shows a schematic cross-sectional side view representation of a section of the cap panel (A), and a down view representation of the section (B).
Figure 6B:
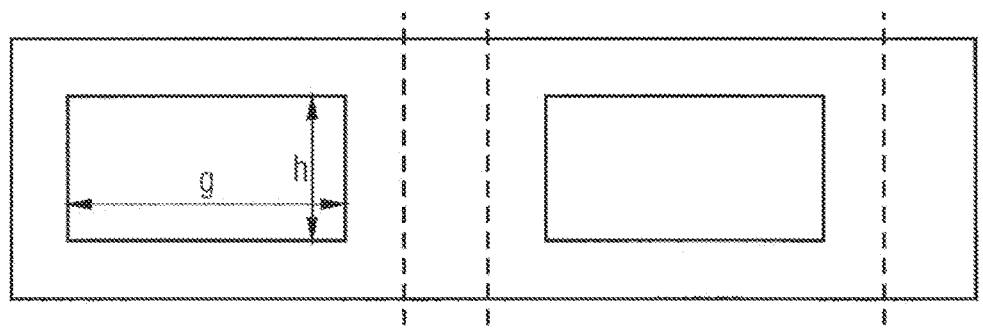

FIG. 6 comprises FIGS. 6A and 6B and illustrates the spatial dimensions of the caps arranged in the panel. FIG. 6 shows a section of a panel comprising a plurality of caps, the section two neighboring caps such as those shown in FIG. 5B and designated with reference signs 55.1. The letters a to h designate different lengths dimensions, wherein a refers to the height of the panel or the caps, b refers to the height or headroom of the cavity of the cap, c refers to the thickness of the upper horizontal wall (wherein a=b+c), d refers to the thickness of the sidewall, e refers to the thickness of the wall separating two neighboring cavities, f refers to the part of e reserved for the sawline, g refers to the length of the cavity, and h refers to the width of the cavity. The ranges of b and c can be as follows:

b: 50 µm to 500 µm c: 50 µm to 300 µm.

Figure 7A:
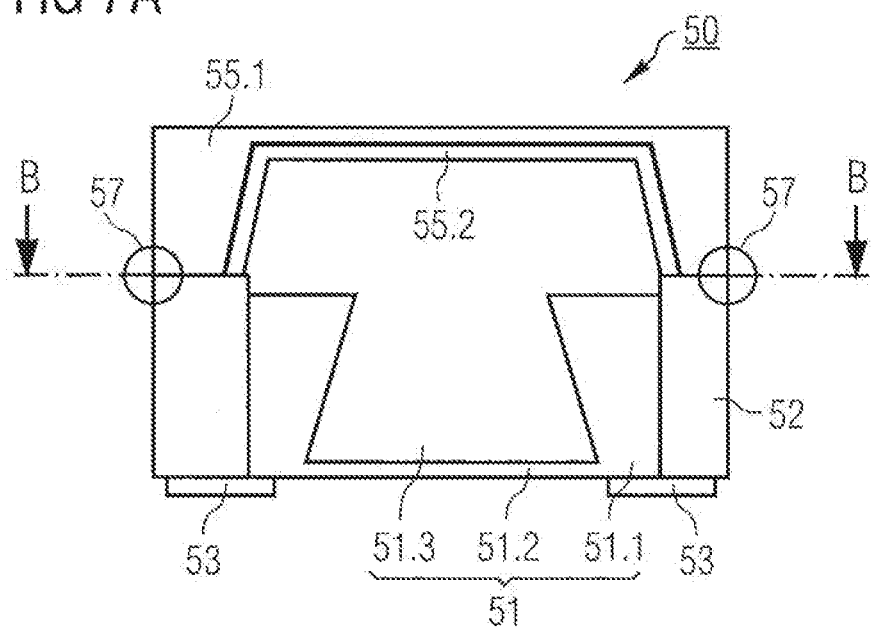
FIG. 7 comprises FIGS. 7A and 7B and shows a schematic cross-sectional side view representation (A) and a down view from a plane designated as B-B in FIG. 7A (B) of a semiconductor module comprising a microphone device without any further electrical devices.
Figure 7B:
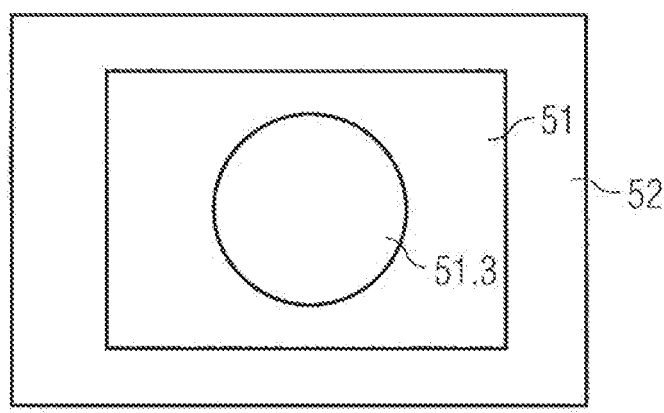

FIG. 7 comprises FIGS. 7A and 7B and shows a schematic cross-sectional side view representation (A) and a down view from a plane designated as B-B in FIG. 7A (B) of a semiconductor module according to a second aspect.

The semiconductor module 50 comprises a semiconductor device 51, and a cap 55 disposed above the semiconductor device 51, wherein the semiconductor module 50 is fabricated by bonding a cap panel comprising a plurality of caps onto a semiconductor panel comprising a plurality of semiconductor devices, and singulating the bonded panels into a plurality of semiconductor modules. Singulating the bonded panels occurs by separating neighboring semiconductor modules 50 along the vertical dashed line as shown in FIG. 5B by, for example, dicing. As a result an outer side wall of the semiconductor module 50 is completely smooth and does not show any lateral step or shoulder at the boundary 57 between the cap 55 and the encapsulant 52. This feature applies to all further examples of semiconductor modules presented here.

As shown in FIGS. 5 and 7, the semiconductor module 50 may be configured in the form of a microphone device 50. The microphone device 50 as shown in FIG. 7 is the left one of the two devices shown in FIG. 5B, accordingly the reference signs were taken over from FIG. 5B. The microphone device may thus comprise a semiconductor body 51 comprising side walls 51.1 and a microphone membrane 51.2 connected between the side walls 51.1, a first mold compound 52 embedding the side walls 51.1, and a cap 55.1 connected with the first mold compound 52, the cap 55.1 being fabricated of a second mold compound.

According to an example of the semiconductor module of the second aspect, the semiconductor device may comprise any kind of sensor device. In the example as shown in FIG. 7 the sensor device is a pressure sensor or microphone. However, the semiconductor device may also comprise one or more of a a shock sensor, an acceleration sensor, a temperature sensor, a gas sensor, a humidity sensor, a magnetic field sensor, an electric field sensor, or an optical sensor.

According to the example of the semiconductor module as shown in FIG. 7, the semiconductor device comprises a MEMS device including the membrane 51.2. It should be noted, however, that the semiconductor device does not necessarily comprise a MEMS device.

According to an example of the semiconductor module of the second aspect, the semiconductor module comprises two or more semiconductor devices. According to an example thereof, the semiconductor module comprises a sensor device and a further electronic device, wherein the further electronic device is connected to the sensor device and is configured to provide power supply to the sensor device and/or read out electrical signals from the sensor device. The further electronic device can, for example, be an ASIC device.

According to an example of the semiconductor module of the second aspect, one or more of the first and second mold compounds comprise a host material comprising one or more of a resin, in particular an epoxy resin, an epoxy silicone, an epoxy polyimide, a bismaleide, a cyanate ester, or a thermoplast.

According to an example of the semiconductor module of the second aspect, the first and second mold compounds comprise different, similar or identical materials, in particular different, similar or identical host materials. According to a further example thereof, the first and second mold compounds comprise different, similar or identical host materials, and one or more of the first and second mold compounds comprise a host material and filler increments embedded therein, in particular the filler increments being made of SiO, Al2O3, ZnO, MgO, AlN, Si3N4, BN, a ceramic material, or a metallic material, in particular Cu, Al, Ag, or Mo.

According to an example of the semiconductor module of the second aspect, the semiconductor module further comprises an electrically conductive layer applied onto an inner wall of the cap 55.1.

According to an example of the semiconductor module of the second aspect, the cap 55.1 comprises inner walls comprising a planar horizontal wall and planar side walls adjoining the horizontal wall. According to a further example thereof the side walls are inclined so that an angle between the horizontal wall and the side walls is different from 90°, in particular greater than 90°.

According to an example of the semiconductor module of the second aspect, the junction between the horizontal wall and the side walls is either sharp or abrupt or smooth or curved.

According to an example of the semiconductor module of the second aspect, the semiconductor module comprises at least one further electronic device. The further electronic device can be, for example, a microcontroller, a processor, an ASIC, etc.

FIG. 8 comprises FIGS. 8A to 8D and shows further examples of semiconductor modules according to the second aspect.

Figure 8A:
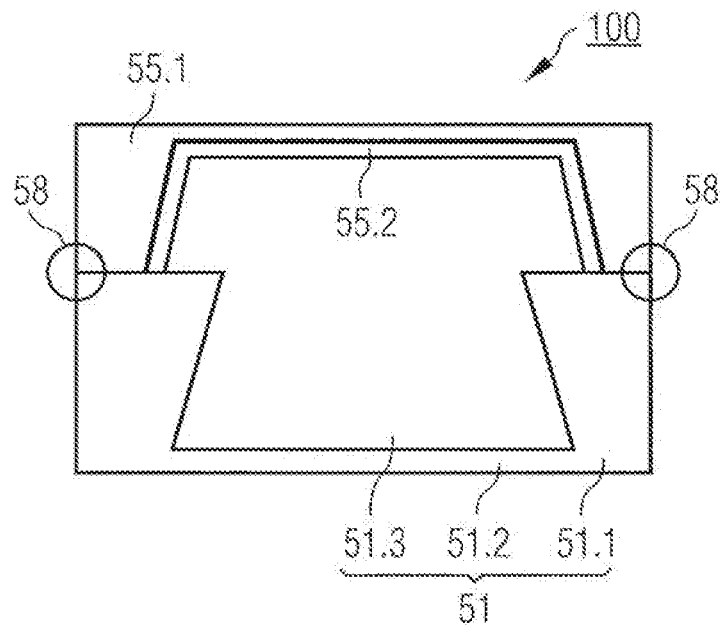
FIG. 8 comprises FIGS. 8A to 8D and shows a schematic cross-sectional side view representation of a semiconductor module comprising a pressure sensor device without encapsulation (A), a semiconductor module comprising a pressure sensor device with encapsulation and a membrane suspended between encapsulation walls (B), a semiconductor module comprising a pressure sensor device and an ASIC (C) with encapsulation, and a semiconductor module comprising two pressure sensor devices with encapsulation and a cap separating the two cavities from each other (D).

FIG. 8A shows a semiconductor module 100 comparable to the one of FIG. 7 but without encapsulation. All the other reference numbers were taken over from FIG. 7. As was explained before, such a semiconductor module 100 may be obtained in cases in which the semiconductor panel is a semiconductor wafer in which the semiconductor devices are fabricated and then the cap panel is bonded onto the semiconductor wafer and finally the bonded panels are singulated by any one of the methods described before. As a result smooth side walls are obtained with no step or shoulder at the boundary between the cap 55.1 and the side wall 51.1 of the semiconductor body 51. Due to the fabrication method an outer side wall of the semiconductor module 100 is completely smooth and does not show any lateral step or shoulder at the boundary 58 between the cap 55 and the encapsulant 52.

Figure 8B:
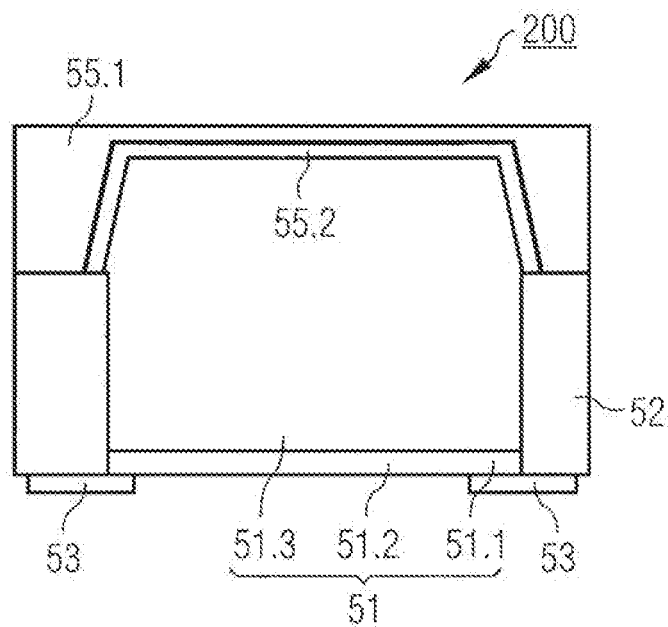

FIG. 8B shows a semiconductor module 200 comparable to the one of FIG. 7 but without the side walls 51.1. Instead the membrane 51.2 is directly suspended between the walls of the encapsulant 52. All the other reference numbers were taken over from FIG. 7.

Figure 8C:
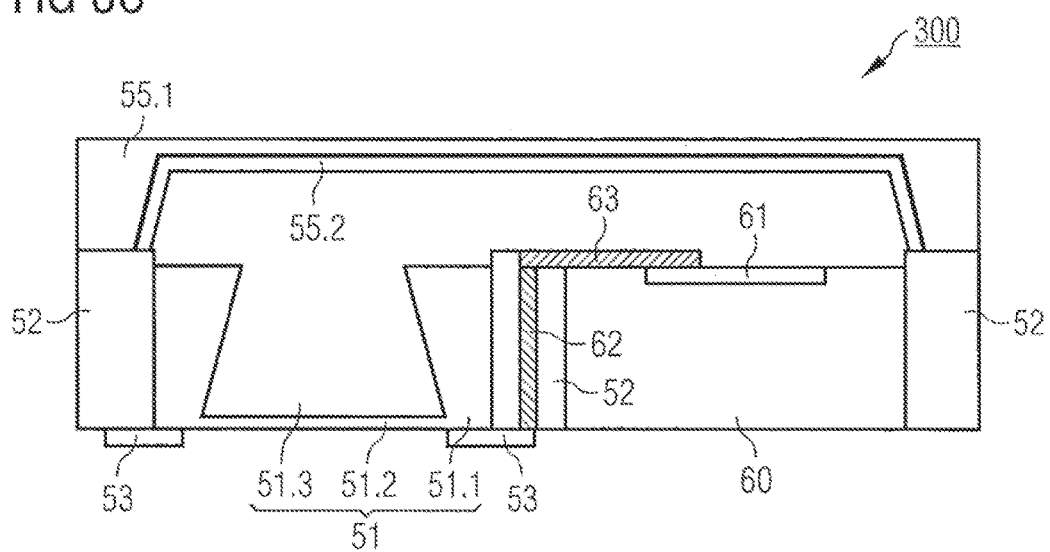

FIG. 8C shows a semiconductor module 300 comparable to the one of FIG. 7 but with an additional electronic device which is also covered by the cap 55.1. In this example the additional electronic device is a silicon chip 60 which comprises an electronic circuit 61 at an upper main face thereof. The electronic circuit 61 can be any kind of control circuit, in particular an ASIC which is connected with the sensor device 51 and is, for example, configured to provide electric power to the sensor device 51 or to read out signals from the sensor device 51, and analog-to-divisional conversion of the read out signals. An electrical through-connection 62 may be formed in one of the walls of the encapsulant 52. The through-connection 62 is connects the contact area 53 of the sensor device 51 with the contact area 63 formed on an upper main face of the silicon chip 60.

Figure 8D:
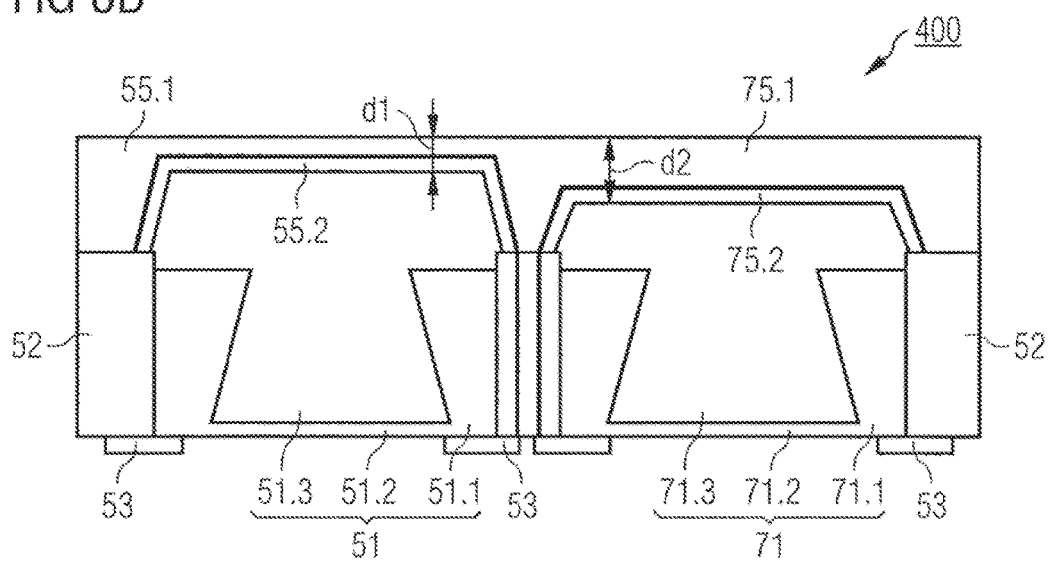

FIG. 8D shows a semiconductor module 100 comparable to the one of FIG. 7 but an additional sensor device 71 attached to the sensor device 51 and separated by it with a wall of the encapsulant 52. The additional sensor device 71 is also covered by a cap 75.1 wherein the cap 75.1 is also covered with an electrically conductive layer 75.2 on its inner wall. The difference between the sensor devices 51 and 71 lies in the different thicknesses of the respective caps 55.1 and 75.1. Whereas the cap 55.1 comprises a thickness a relatively small thickness dl, the cap 75.1 comprises a relatively large thickness 75.1. As a result the cavity of the sensor device 51 has a larger volume than the cavity of the sensor device 71 and thus has a greater signal-to-noise ration and sensitivity.

The present disclosure also relates to a packaged MEMS device to a third aspect. The packaged MEMS device according to the third aspect comprises an embedding arrangement, a MEMS device disposed in the embedding arrangement, a cap disposed above the MEMS device, wherein the packaged MEMS device is fabricated by bonding a cap panel comprising a plurality of caps onto a MEMS panel comprising a plurality of MEMS devices, and singulating the bonded panels into a plurality of packaged MEMS devices.

According to an example of the packaged MEMS device the MEMS device comprises a sensor device.

According to an example of the packaged MEMS device the MEMS device comprises one or more of a pressure sensor, a shock sensor, an acceleration sensor, a temperature sensor, a gas sensor, a humidity sensor, a magnetic field sensor, an electric field sensor, or an optical sensor.

According to an example of the packaged MEMS device the MEMS device comprises two or more semiconductor devices. According to a further example thereof the MEMS device comprises a sensor device and a further electronic device, wherein the further electronic device is connected to the sensor device and is configured to provide power supply to the sensor device and/or read out electrical signals from the sensor device. According to a further example thereof the further electronic device is an ASIC device.

According to an example of the packaged MEMS device of the third aspect, the cap comprises inner walls comprising a planar horizontal wall and planar side walls adjoining the horizontal wall.

According to an example of the packaged MEMS device of the third aspect, the side walls are inclined so that an angle between the horizontal wall and the side walls is different from 90°, in particular greater than 90°.

According to an example of the packaged MEMS device of the third aspect, the junction between the horizontal wall and the side walls is sharp or abrupt.

Further examples of the packaged MEMS device of the third aspect can be formed by incorporating example or features which were described above in connection with the method for producing a semiconductor module of the first aspect or the semiconductor module of the second aspect.

While the invention has been illustrated and described with respect to one or more implementations, alterations and/or modifications may be made to the illustrated examples without departing from the spirit and scope of the appended claims. In particular with regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for producing a semiconductor module, the method comprising:
    fabricating a semiconductor panel comprising a first mold compound having a plurality of semiconductor devices embedded therein, wherein for each semiconductor device, the first mold compound defines side walls that surround an inner space;
    fabricating a cap panel comprising a second mold compound that includes a plurality of caps, wherein each cap is defined by a cavity formed within the second mold compound;
    bonding the cap panel onto the semiconductor panel so that each one of the caps covers one or more of the semiconductor devices; and
    singulating the first mold compound and the second mold compound of the bonded panels into a plurality of semiconductor modules.

2. The method according to claim 1, further comprising:
    fabricating the cap panel comprises forming.

3. The method according to claim 2, wherein
    fabricating the cap panel comprises molding.

4. The method according to claim 1, wherein
    each one of the semiconductor devices comprises a sensor device.

5. The method according to claim 4, wherein
    each one of the semiconductor devices comprises one or more of a pressure sensor, a shock sensor, an acceleration sensor, a temperature sensor, a gas sensor, a humidity sensor, a magnetic field sensor, an electric field sensor, or an optical sensor.

6. The method according to claim 1, wherein
    each one of the semiconductor devices comprises a MEMS device.

7. The method according to claim 1, wherein
    the semiconductor panel is a reconfigured wafer obtained by processing a plurality of semiconductor chips in a semiconductor wafer, dicing out the semiconductor chips, and embedding the semiconductor chips in an encapsulant.

8. The method according to claim 1, further comprising:
    fabricating the cap panel comprises providing the caps or portions thereof with an electrical conductivity.

9. A semiconductor module, comprising:
    a semiconductor device that includes a first mold compound that embeds a semiconductor body, wherein the first mold compound defines side walls that surround an inner space;
    and
    a cap formed from a second mold compound that is disposed above the semiconductor device such that vertical walls of the cap are aligned with the walls of the first mold compound,
    wherein the semiconductor module is fabricated by bonding a cap panel comprising a plurality of caps onto a semiconductor panel comprising a plurality of semiconductor devices, and singulating the bonded panels into a plurality of semiconductor modules.

10. The semiconductor module according to claim 9, wherein
    the semiconductor device comprises a sensor device.

11. The semiconductor module according to claim 10, wherein
    the semiconductor device comprises one or more of a pressure sensor, a shock sensor, an acceleration sensor, a temperature sensor, a gas sensor, a humidity sensor, a magnetic field sensor, an electric field sensor, or an optical sensor.

12. The semiconductor module according to claim 9, wherein
    the semiconductor device comprises a MEMS device.

13. The semiconductor module according to claim 9, wherein
    the semiconductor module comprises two or more semiconductor devices.

14. The semiconductor module according to claim 13, wherein
    the semiconductor module comprises a sensor device and a further electronic device, wherein the further electronic device is connected to the sensor device and is configured to provide power supply to the sensor device and/or read out electrical signals from the sensor device.

15. The semiconductor module according to claim 14, wherein
the further electronic device is an ASIC device.

16. A packaged MEMS device, comprising:
an embedding arrangement that includes a first mold compound that defines side walls that surround an inner space;
a MEMS device disposed in the embedding arrangement;
a cap formed from a second mold compound and disposed above the MEMS device such that vertical walls of the cap are aligned with the side walls of the first mold compound,
wherein the packaged MEMS device is fabricated by bonding a cap panel comprising a plurality of caps onto a MEMS panel comprising a plurality of MEMS devices, and singulating the bonded panels into a plurality of packaged MEMS devices.

17. The packaged MEMS device according to claim 16, wherein
the MEMS device comprises a sensor device.

18. The packaged MEMS device according to claim 17, wherein
the MEMS device comprises one or more of a pressure sensor, a shock sensor, an acceleration sensor, a temperature sensor, a gas sensor, a humidity sensor, a magnetic field sensor, an electric field sensor, or an optical sensor.

19. The packaged MEMS device according to claim 16, wherein
the MEMS device comprises two or more semiconductor devices.

20. The packaged MEMS device according to claim 19, wherein
the MEMS device comprises a sensor device and a further electronic device, wherein the further electronic device is connected to the sensor device and is configured to provide power supply to the sensor device and/or read out electrical signals from the sensor device.

21. The packaged MEMS device according to claim 20, wherein
the further electronic device is an ASIC device.

* * * * *